United States Patent
Fujishima

(10) Patent No.: US 6,624,470 B2
(45) Date of Patent: Sep. 23, 2003

(54) SEMICONDUCTOR DEVICE AND A METHOD FOR MANUFACTURING SAME

(75) Inventor: Naoto Fujishima, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 10/156,757

(22) Filed: May 29, 2002

(65) Prior Publication Data

US 2002/0179928 A1 Dec. 5, 2002

(30) Foreign Application Priority Data

May 30, 2001 (JP) ........................... 2001-162384

(51) Int. Cl.⁷ ................. H01L 29/76; H01L 29/94
(52) U.S. Cl. ............................. 257/331; 257/333
(58) Field of Search ........................ 257/329, 330, 257/331, 332, 333, 334

(56) References Cited

U.S. PATENT DOCUMENTS 6,495,883 B2 * 12/2002 Shibata et al.
6,545,316 B1 * 4/2003 Baliga

FOREIGN PATENT DOCUMENTS

| EP | 1094525 | * | 4/2001 |
|---|---|---|---|
| JP | 2000-114512 | | 4/2000 |

OTHER PUBLICATIONS

Fujishima, Naoto and Salama, C. Andre T., "A Trench Lateral Power MOSFET Using Self–Aligned Trench Bottom Contact Holes", *Department of Electrical and Computer Engineering, University of Toronto, Toronto, Ontario, Canada M5S 3G4*, 4 pages, IEEE, 1997.

Parthasarathy, V., et al., "A 0.35μm CMOS Based Smart Power Technology For 7V–50V Applications", *SmartMOS Technology Center, Semiconductor Products Sector, Motorola Inc.*, 4 pages, IEEE, 2000, Catalog No. 00CH37094C.

U.S. patent application Ser. No. 10/156,641, Fujishima, filed May 29, 2002.

* cited by examiner

Primary Examiner—Stephen D. Meier

(57) ABSTRACT

A semiconductor device, and method for manufacturing the same, manufactured by a simpler process, compared to a conventional trench lateral power MOSFET for a withstand voltage of 80 V, having a smaller device pitch and lower on-resistance per unit area as compared with a conventional lateral power MOSFET with a withstand voltage lower than 80 V. The semiconductor device may include a shallow and narrow trench formed in a substrate with small spacing, a drift region that is an n diffusion region formed around the trench, a gate oxide film having a uniform thickness of about 0.05 μm formed inside the trench, a gate polysilicon formed inside the gate oxide film, a base region and a source region that is an n⁺ diffusion region formed in the surface region of the substrate, a drain region that is an n⁺ diffusion region formed at the trench bottom, interlayer dielectric provided inside the gate polysilicon, and drain polysilicon filling a space inside the interlayer dielectric in the trench and electrically connecting to the drain region.

3 Claims, 16 Drawing Sheets

SEMICONDUCTOR DEVICE AND A METHOD FOR MANUFACTURING SAME

CROSS-REFERENCE TO RELATED APPLICATIONS

This application claims the benefit of Japanese Patent Application No. 2001-162384, filed on May 30, 2001, the disclosure of which is incorporated herein by reference.

1. Field of the Invention

The present invention relates to a semiconductor device, in particular, to a low on-resistance power MOSFET or an insulated gate field effect transistor that is used in an IC exhibiting high breakdown voltage and controlling high current, for example, an IC in a switching regulator, an IC for driving an automobile electric power system, or an IC for driving a flat panel display. The present invention also relates to a method for manufacturing such a semiconductor device.

2. Description of the Related Art

The importance of power ICs containing a power MOSFET has been increasing with the rapid spread of portable apparatuses and advancements of communications technology in recent years. A power IC integrating a lateral power MOSFET with a control circuit is expected to achieve miniaturization, low power consumption, high reliability, and low cost in comparison with a conventional construction combining a discrete power MOSFET with a controlling and driving circuit. Consequently, developmental work is actively being conducted for high performance lateral power MOSFETs based on CMOS processes.

FIG. 13 is a cross sectional view showing a structure of a conventional lateral power MOSFET for a withstand voltage of 30 V. This lateral power MOSFET 101 includes p⁻ well 11, gate oxide film 12, gate electrode 13, source electrode 14, and drain electrode 15 that are formed on a p⁻ substrate 10. The lateral power MOSFET 101 further includes p diffusion region 16, n⁺ diffusion region 17, n⁻ drift region 18, and n⁺ diffusion region 19 formed in the surface region of the p⁻ well 411 arranged laterally.

This type of lateral power MOSFET is limited in miniaturization because an extended drain formed on the surface region of the substrate to ensure a withstand voltage. A punch through voltage also limits the miniaturization since a channel is formed in the direction parallel to the substrate surface in this type of MOSFET. Because the drift region 18 and the channel are formed in parallel with the substrate surface, density of integrated devices cannot be raised. Therefore, the channel width per unit area cannot be increased. Thereby, restricting reduction of on-resistance per unit area.

A large number of reports have been made on lateral power MOSFETs. For example, a paper entitled "A 0.35 μm CMOS based smart power technology for 7 V–50 V applications," in Proceedings of ISPSD 2000 by V. Parthasarathy et al., discloses a lateral power MOSFET that exhibits the breakdown voltage of 44 V and on-resistance per unit area of 30 mΩ-mm². A device pitch is estimated to be 3.6 μm in the case of 0.35 μm rule, where the device pitch is a distance from the source center to the drain center, that is the sum of lengths L11, L12, L13 and L14 shown in FIG. 13. When a required withstand voltage increases, the drift region becomes larger, resulting in larger device pitch.

A MOSFET having a trench structure for reducing the device pitch and enhancing degree of integration of a device is known. Rather, the inventor of the present invention has proposed a lateral power MOSFET employing a trench structure (hereinafter referred to as "a trench lateral power MOSFET") in the paper entitled "A trench lateral power MOSFET using self-aligned trench bottom contact holes" in IEDM '97 Digest, p. 359–362, 1997. FIGS. 14 through 16 show the structure of the trench lateral power MOSFET. FIG. 14 is a plan view. FIG. 15 is a cross-sectional view along the line A—A of FIG. 14 and shows the structure of an active region where electric current is driven as a MOSFET operation.

FIG. 16 is a cross-sectional view along the line B—B of FIG. 14 and shows the structure of a gate region where gate polysilicon is lead out to the substrate surface.

This MOSFET 102 includes a gate oxide film 22 formed on an inner wall of a trench 21 that is formed in a p⁻ substrate 20, gate polysilicon 23 formed inside a gate oxide film 22, a drain region 29 that is an n⁺ diffusion region is formed at a bottom of the trench 21, and a source region 27 that is an n⁺ diffusion region is formed at the outer periphery of the trench 21. The drain region 29 is surrounded by an n⁻ drain region 28 that is an n⁻ diffusion region surrounding the lower portion of the trench 21. The n⁻ drain region 28 is surrounded by a p body region 31 that is a p⁻ diffusion region.

A p⁺ diffusion region 32 is formed outside the source region 27, and a p base region 33 is formed under the source region 27. A thick oxide film 34 is provided in the lower portion of the trench 21 to ensure a withstand voltage. In FIGS. 14 through 16, symbol 24 represents a source electrode, symbol 25 a drain electrode, symbol 26 an interlayer oxide film, symbol 35 a gate electrode, symbols 36 and 37 contact parts, symbol 38 an n⁺ diffusion region, and symbols 39 and 40 represent interlayer oxide films. The on-resistance per unit area of the trench lateral power MOSFET 102 with the breakdown voltage of 80 V is 80 mΩ-mm². The device pitch is 4 μm, which is about half the device pitch of a conventional lateral power MOSFET with a breakdown voltage of 80 V.

In a lateral power MOSFET with a withstand voltage lower than 80 V, say 30 V, it is desirable to reduce the device pitch. However, since the trench lateral power MOSFET 102, as shown in FIGS. 14 through 16, is suitable for the withstand voltage of 80 V, it is inexpedient to apply the same structure to a MOSFET with a withstand voltage lower than 80 V. Specifically, the thick oxide film 34 for securing a withstand voltage in a MOSFET with a withstand voltage lower than 80 V may be thinner than the thickness in a MOSFET for the withstand voltage of 80 V. Accordingly, an overall size of the MOSFET can be reduced if the thickness of this oxide film 34 is reduced to the minimum required dimension for the withstand voltage lower than 80 V. On the contrary, if the same structure as the device for the withstand voltage of 80 V is applied, the overall size of the device becomes larger than a device in which the thickness of the oxide film 34 for ensuring that a withstand voltage is optimized. As a result, poor performances occur, e.g., larger wiring resistance around the semiconductor element.

The area of the gate is also excessively large, in comparison with the case in which the thickness of the oxide film 34 is optimized. As a result, parasitic capacity of the gate increases and driving losses increase. In a manufacturing process of the trench lateral power MOSFET 102, a shallow trench is first dug. After protecting the side wall of the trench with a nitride film, a deep trench is dug and then, thermally oxidized to form the thick oxide film 34. Thus, the manufacturing process is rather complicated, which may result in a lowering of yield rate.

SUMMARY OF THE INVENTION

The present invention has been made in view of the above problems, with an object of the invention being to provide a semiconductor device making a trench lateral MOSFET that can be manufactured by a process simpler than the process for a conventional trench lateral power MOSFET with a withstand voltage of 80 V class, and is optimized for a withstand voltage lower than 80 V so as to have a device pitch smaller than that of a conventional lateral power MOSFET with a withstand voltage lower than 80 V, and to exhibit low on-resistance per unit area.

Another object of the present invention is to provide a method for manufacturing such a trench lateral MOSFET.

Additional objects and advantages of the invention will be set forth in part in the description which follows and, in part, will be obvious from the description, or may be learned by practice of the invention.

To attain the above objects, a semiconductor device of an embodiment of the present invention includes trenches that are formed shallow and narrow with a short pitch in a semiconductor substrate, a drift region formed around the trench, a gate insulating film having a uniform thickness of about 0.05 $\mu$m, for example, formed on the inner wall of the trench, gate polysilicon formed inside the gate insulating film, a base region and a source region formed in the surface region of the substrate, a drain region formed at the trench bottom, interlayer dielectric provided inside the gate polysilicon, and drain polysilicon filling a space inside the interlayer dielectric and electrically connecting to the drain region.

According to another an embodiment of the present invention, a channel region, which needs a certain distance for achieving high breakdown voltage, is formed vertically along the side wall of the trench. The drift region formed at the trench bottom corresponding to a thickness of the interlayer dielectric has a function to relax the electric field of this region. The regions required by the device pitch are only a source contact region and a drain contact region. Because a MOSFET is formed by means of self-aligning at the side wall region of the trench, precise mask alignment is not necessary. A thick oxide film for ensuring a high withstand voltage is also unnecessary unlike a conventional trench lateral power MOSFET for a withstand voltage of 80 V. Trench etching may only need to be conducted once in the manufacturing process of this embodiment of the present invention.

BRIEF DESCRIPTION OF THE DRAWINGS

These and other objects and advantages of the present invention will become apparent and more readily appreciated from the following description of the embodiments, taken in conjunction with the accompanying drawings of which.

DETAILED DESCRIPTION OF THE PREFERRED EMBODIMENTS

Aspects of some preferred embodiments of the present invention will be described in detail in the following with reference to accompanying drawings. Although the following description will be made in the case a first conductivity type is p-type and a second conductivity type is n-type, the present invention is also applicable to the reversed case.

Figure 1:
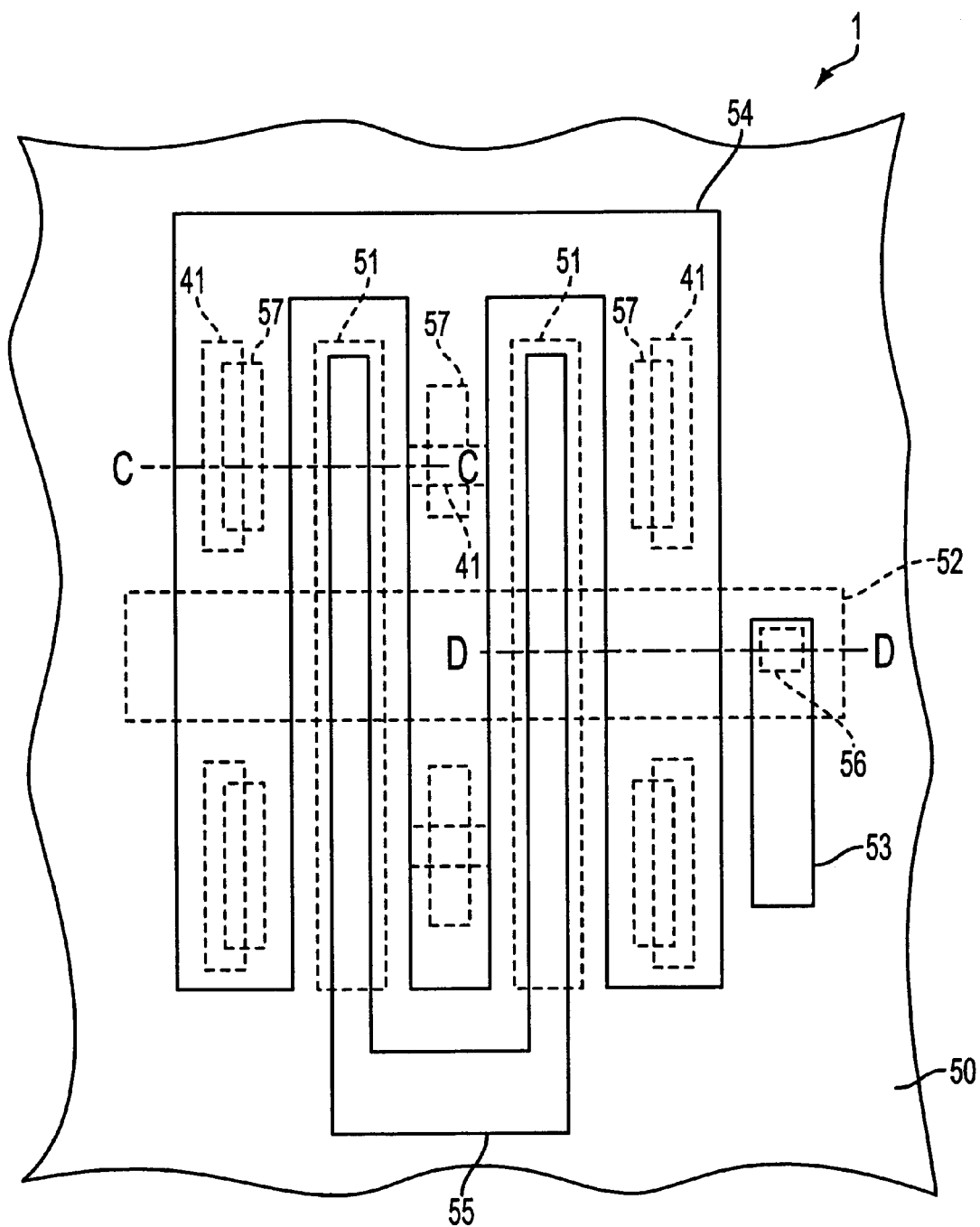
FIG. 1 is a plan view showing a trench lateral power MOSFET according to an embodiment of the present invention.

FIG. 1 is a plan view showing a trench lateral power MOSFET according to an embodiment of the present invention. This trench lateral power MOSFET 1 includes a p-type substrate 50, a plurality of trenches 51 in a stripe shape formed in the substrate, a gate polysilicon 52 crossing the trenches 51. The substrate surface includes a gate electrode 53, a source electrode 54 in a comb shape, and a drain electrode 55 in a comb shape, as shown in FIG. 1.

The gate polysilicon 52 electrically connects to the gate electrode 53 through a contact part 56. The drain electrode 55 also electrically connects to drain polysilicon in the trench 51 through a contact part, although not illustrated in FIG. 1. This drain polysilicon electrically connects to a drain region that is an n$^+$ diffusion region formed at the trench bottom. The source electrode 54 electrically connects to a source region that is an n$^+$ diffusion region through contact part 57. As illustrated In FIG. 1, a portion of the substrate surface excluding the region of the p$^+$ diffusion region 41 and the trench 51 is an n$^+$ diffusion region, and a portion under that portion excluding the regions of the trench 51 is a base region.

Figure 2:
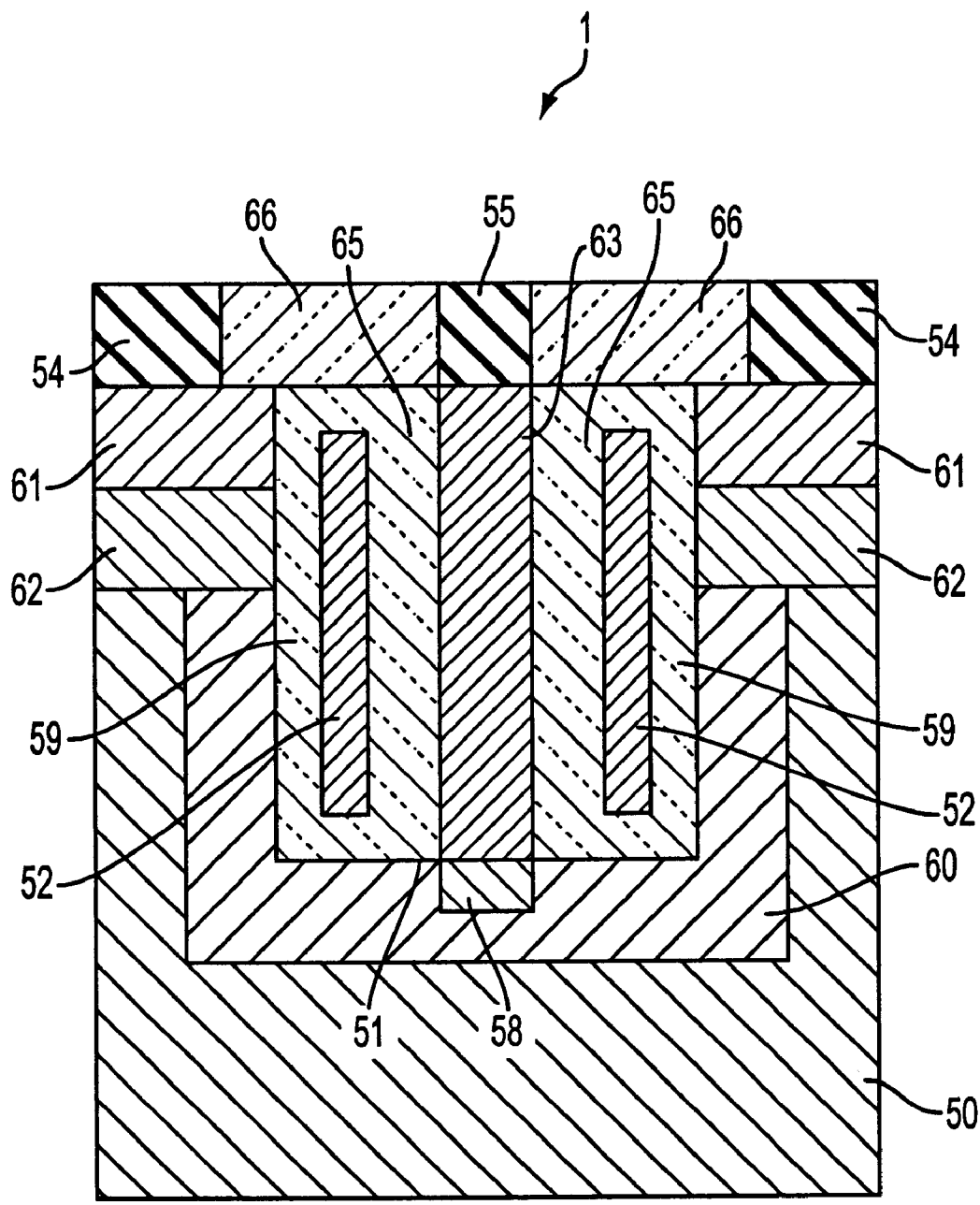
FIG. 2 is a cross-sectional view along the line C—C in FIG. 1.

The following describes a sectional structure in an active region in which electric current is driven as a MOSFET operation. FIG. 2 shows a cross-sectional view along line C—C of FIG. 1, and illustrates a structure in the active region. Gate oxide film 59, which is a gate insulating film, is formed along side walls of the trench 51 with a uniform thickness. This gate oxide film 59 also coats the bottom surface of the trench 51. Gate polysilicon 52, which is a first conductor, is formed inside the gate oxide film 59 on almost the whole vertical range of the trench 51. The gate polysilicon 52 extends to a gate region, which will be described below with reference to FIG. 3.

The region outside the lower half of the trench 51 is an n-type drift region 60 that is an n diffusion region. A drain region 58, which is an n$^+$ diffusion region, is formed at the center of the trench bottom in the n-type drift region 60. The drain region 58 electrically connects to the drain electrode 55 through the drain polysilicon 63, which is a second conductor, formed in the trench 51. In the trench 51, the drain polysilicon 63 is insulated from the gate polysilicon 52 with an interlayer oxide film 65 that is an interlayer dielectric.

The region outside the upper half of the trench 51 is a p base region 62. In the substrate surface region on the p base region 62, a source region 61, which is an n$^+$ diffusion region, is formed. The source region 61 electrically connects to a source electrode 54 formed on the substrate surface. Symbol 66 in FIG. 2 represents an interlayer oxide film that is interlayer dielectric.

Figure 3:
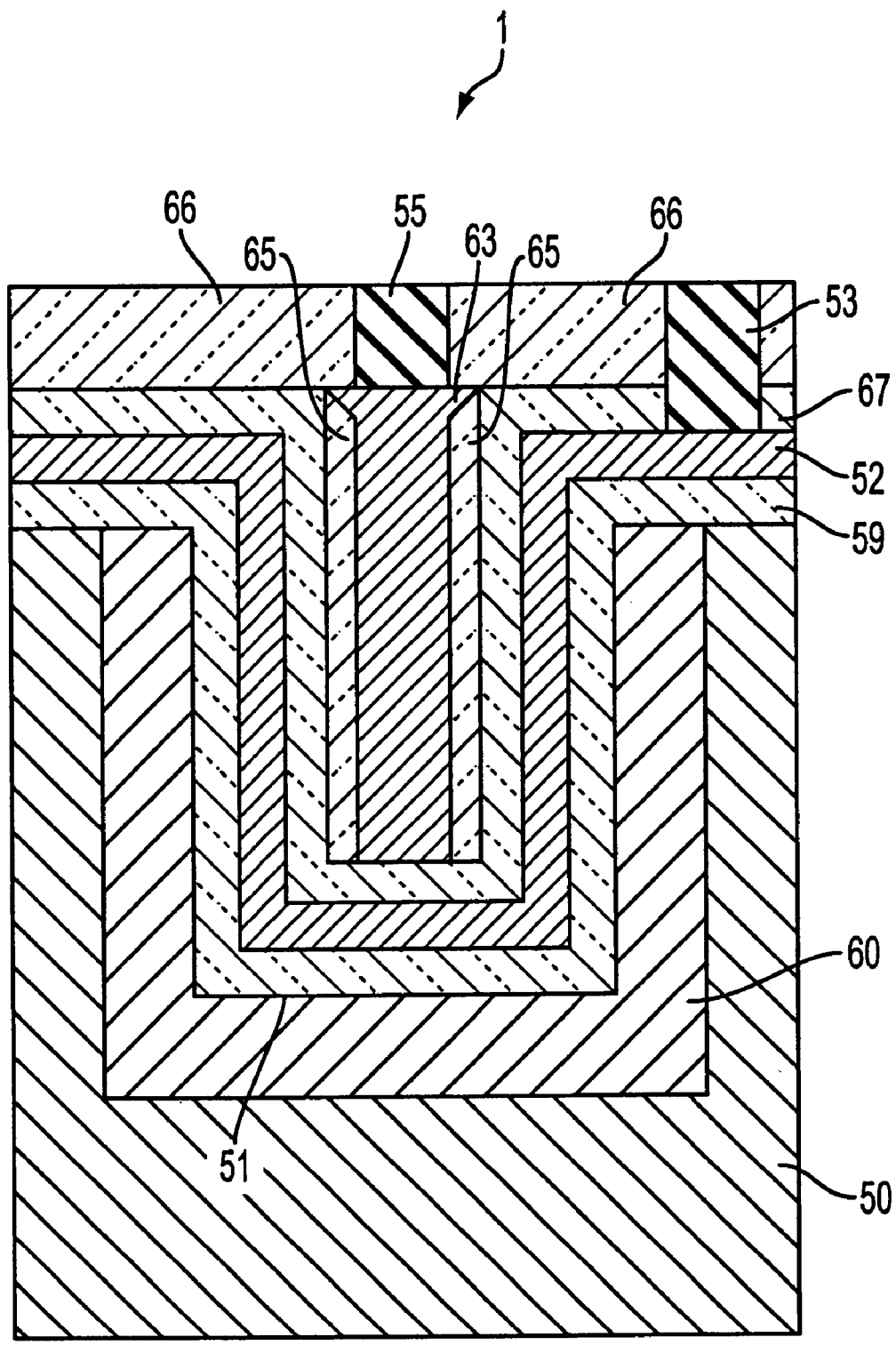
FIG. 3 is a cross-sectional view along the line D—D in FIG. 1.

Next, description will be made regarding a sectional structure in a gate region where the gate polysilicon 52 is lead out to the substrate surface. FIG. 3 is a cross-sectional view along line D—D of FIG. 1 and shows the structure in the gate region. The region outside the trench 51 is the above-mentioned n-type drift region 60 that is an n diffusion region. The gate oxide film 59 is formed along the side and bottom surfaces of the trench 51 with a uniform thickness. The gate oxide film 59 also coats the substrate surface. The gate polysilicon 52 is formed on the gate oxide film 59 along the inner surface of the trench 51 and on the substrate surface.

An interlayer oxide film 67 is laminated on the surface of the gate polysilicon 52 along the gate polysilicon 52. A space in the trench 51 between the interlayer oxide films 67 is provided with the above-mentioned polysilicon 63 through the interlayer oxide film 65. The interlayer oxide film 66 is laminated on the polysilicon 63 and on the interlayer oxide film 67.

The gate region and the active region having the above described sectional structures may exist in one semiconductor element. Examples of the dimensions of the parts and surface concentration of impurities are given below. Regarding the trench 51, the depth may be 2 μm, and the width may be 3 μm, for example. The spacing between the trenches may be 3 μm. On the substrate surface region, in this 3 μm spacing between the trenches 51, p base region 62 is formed along with the source region 61, which is an n$^+$ diffusion region. The diffusion depth of the p base region 62 may be 1 μm and the surface concentration may be $1\times10^{18}$ cm$^{-2}$, for example. For both the drain region 58 that is an n$^+$ diffusion region and the source region 61 that is an n$^+$ diffusion region, diffusion depth may be 0.2 μm and surface concentration may be $1\times10^{20}$ cm$^{-2}$, for example. For the drift region 60, which is an n diffusion region, diffusion depth may be 2 μm and surface concentration may be $2\times10^{16}$ cm$^{-2}$, for example. Thickness of the gate oxide film 59 would be 0.05 μm with the thickness of the gate polysilicon 52 being 0.3 μm, for example.

Figure 4:
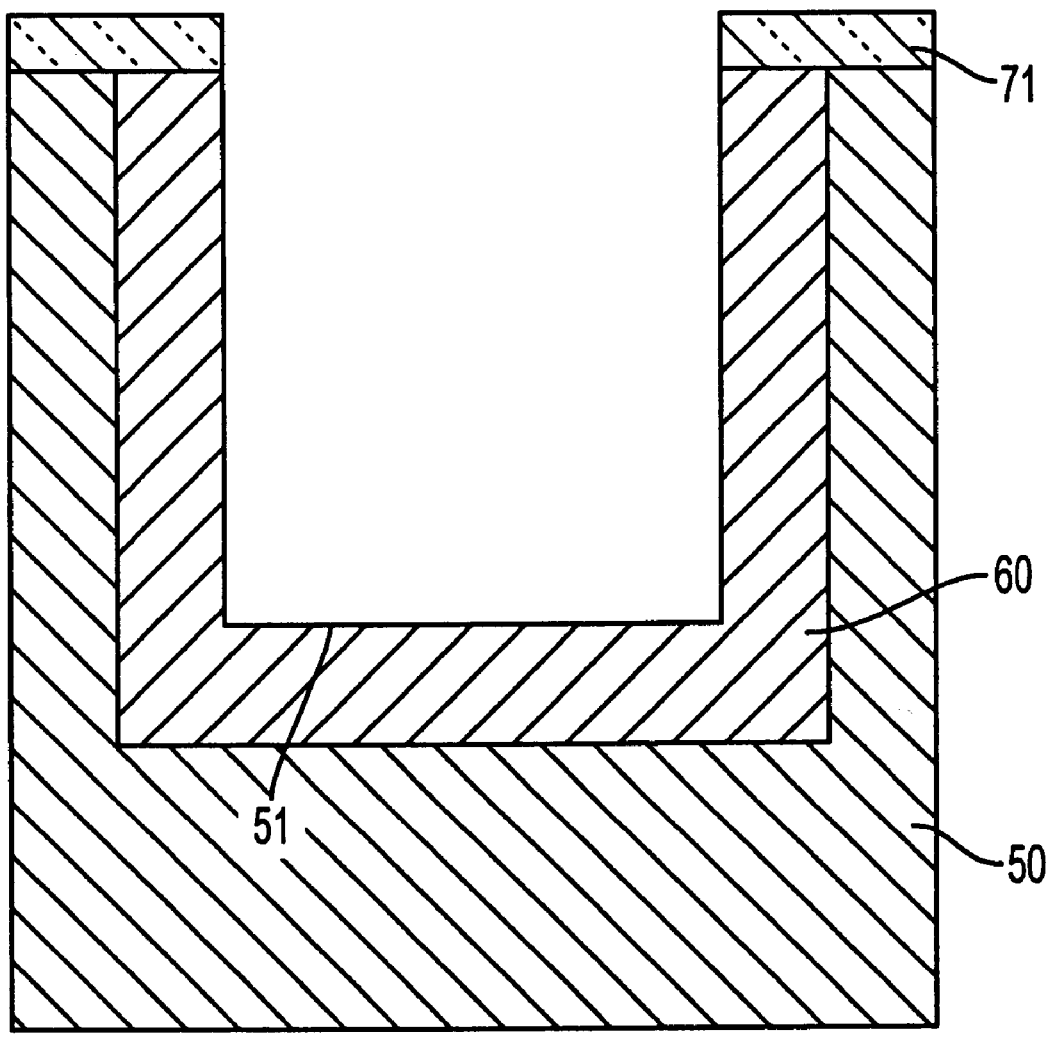
FIG. 4 is a cross-sectional view showing a trench lateral power MOSFET embodiment in a step of a process for manufacturing a MOSFET.

A manufacturing process of a trench lateral power MOSFET 1 according to an embodiment of the present invention will be described below. FIGS. 4 through 12 are cross-sectional views showing preferential steps in the manufacturing process of a trench lateral power MOSFET. Each figure illustrates only one trench. At first, a mask oxide film 71 having thickness of 1 μm may be grown on a p-type substrate 50 having resistivity of 12 Ωcm. A portion of the mask oxide film 71 is selectively removed to make an opening for the trench formation. Using the patterned mask oxide film as a mask for RIE (reactive ion etching), a plurality of trenches 51 may be formed having a width of 3 μm, with a spacing of 3 μm between trenches. The drift region 60, which is an n diffusion region is formed in a side and bottom surface region of the trench 51 in the substrate 50 by using an oblique ion implantation, for example, as shown in FIG. 4.

Figure 5:
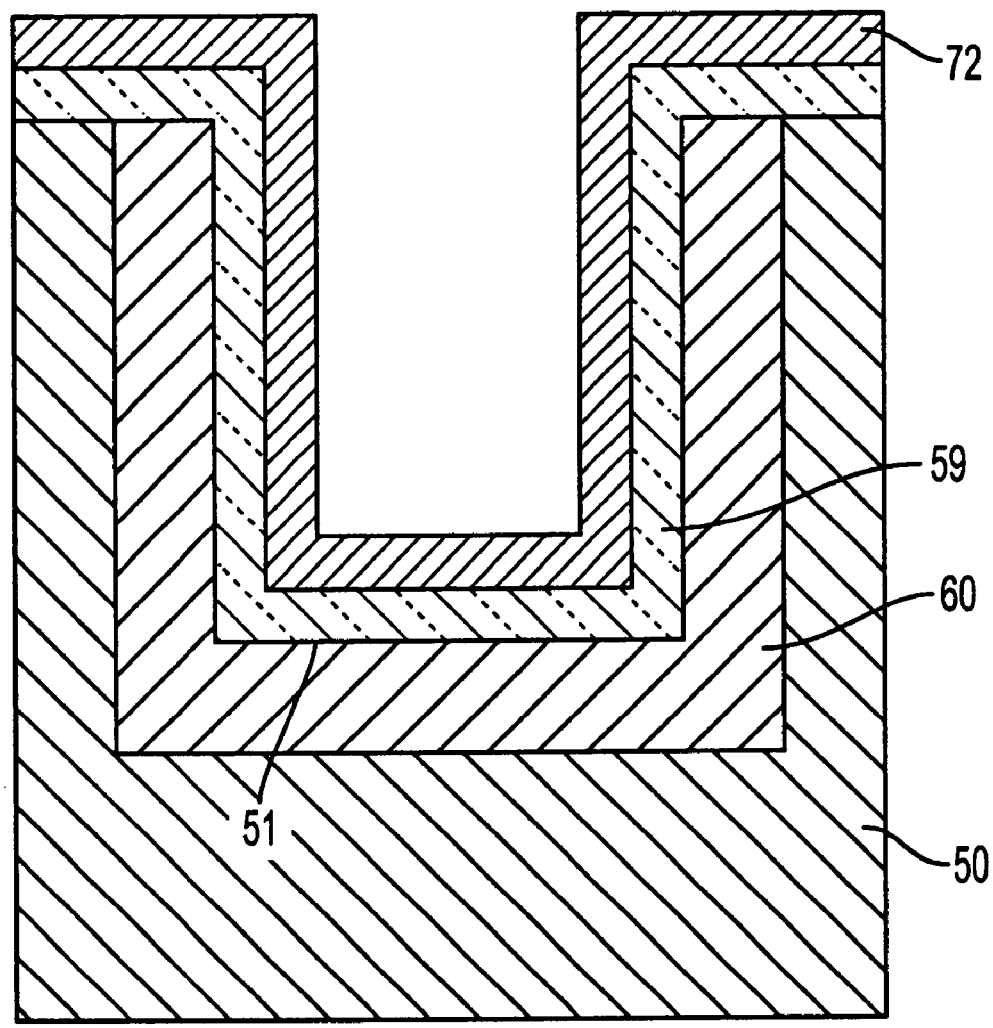
FIG. 5 is a cross-sectional view showing another a trench lateral power MOSFET embodiment in a step of a process for manufacturing a MOSFET.
Figure 6:
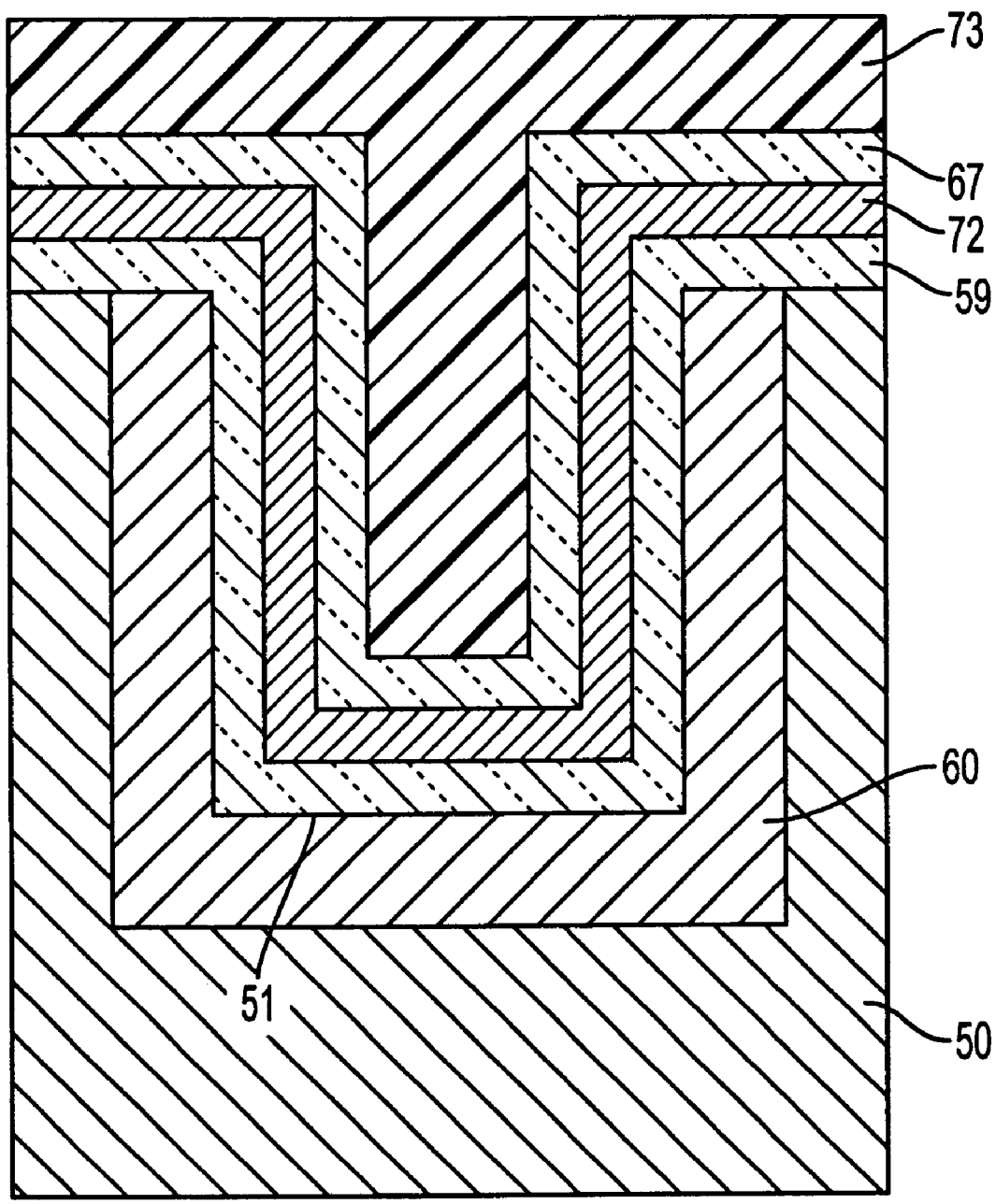
FIG. 6 is a cross-sectional view showing another a trench lateral power MOSFET embodiment in a step of a process for manufacturing a MOSFET.

After removing the mask oxide film 71, the side surface of the trench 51 may be cleaned by using sacrificed oxidation. Then, a gate oxide film 59, having thickness of 0.05 μm, for example, is formed on the side and bottom surface of the trench. The gate oxide film 59 extends to the substrate surface. Polysilicon 72 having thickness of 0.3 μm, for example, is deposited on the gate oxide film 59. On the polysilicon 72, an interlayer oxide film 67 having thickness of 0.4 μm, for example, is deposited. After that, photoresist is applied and by exposure and development, a resist mask 73 may be selectively formed only on the gate region. Photoresist on the active region may then be removed. Using the resist mask 73, the interlayer oxide film 67 may be selectively removed. In this step, the interlayer oxide film 67 is removed in the active region to expose the polysilicon 72 as shown in FIG. 5. In the gate region, the interlayer oxide film 67 and the resist mask 73 remain there as shown in FIG. 6.

Subsequently, the remained resist mask 73 is removed and the polysilicon 72 is etch-backed using an anisotropic etching, for example. In this step, the polysilicon 72 in the active region is removed except for a side surface of the trench, that is, the polysilicon is left only on the side surface of the trench. The remaining polysilicon 72 becomes the gate polysilicon 52 in the active region. In the etch-back step, the polysilicon 72 may be over-etched until the top of the remained polysilicon becomes lower than the upper surface of the trench 51, that is, the level of the original substrate surface. As a result, the top of the polysilicon 72 is lower than the upper surface of the gate oxide film 59 on the substrate surface by an amount of over-etching $t_{ov}$.

Figure 7:
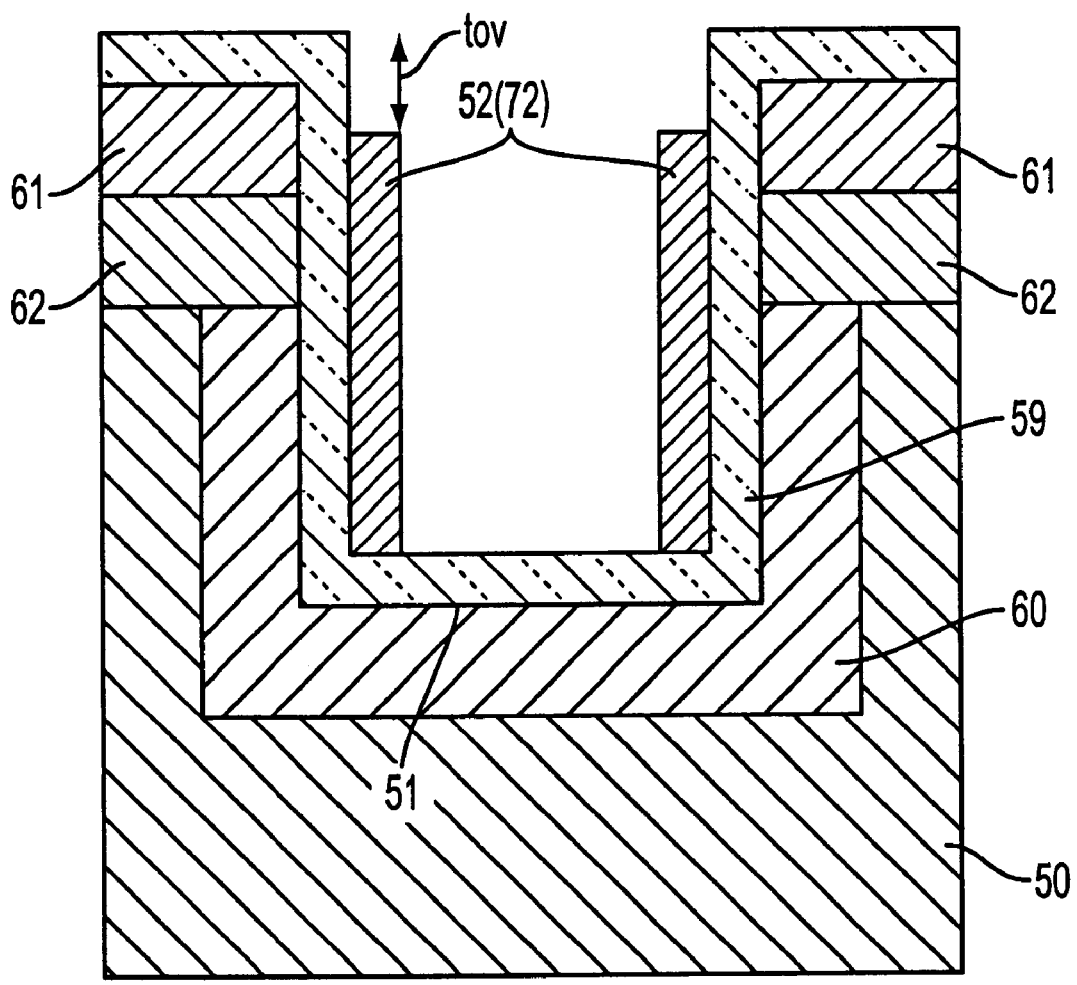
FIG. 7 is a cross-sectional view showing another a trench lateral power MOSFET embodiment in a step of a process for manufacturing a MOSFET.
Figure 8:
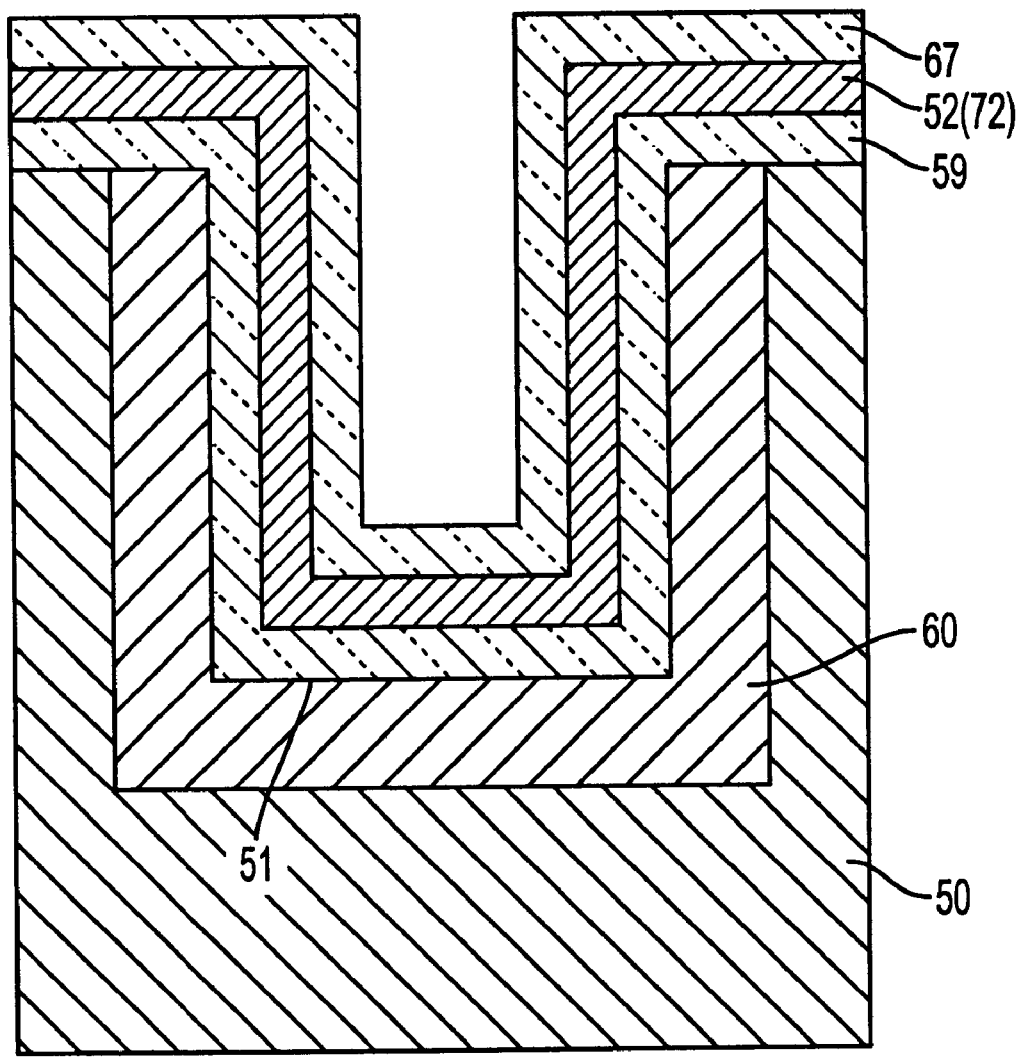
FIG. 8 is a cross-sectional view showing another a trench lateral power MOSFET embodiment in a step of a process for manufacturing a MOSFET.

Then, ion-implantation may be conducted onto the substrate surface, followed by driving-in thermal annealing to form a p base region 62 and a source region 61 that is an n$^+$ diffusion region in the active region, as shown in FIG. 7. The p base region 62 may have a diffusion depth of 1 μm and a surface concentration of $1\times10^{18}$ cm$^{-2}$, for example. The source region 61 may have a diffusion depth of 0.2 μm and a surface concentration of $1\times10^{20}$ cm$^{-2}$, for example. In the gate region, etching of the polysilicon 72 is obstructed by the interlayer oxide film 67, so that the polysilicon 72 remains as a gate polysilicon 52, as shown in FIG. 8.

Figure 9:
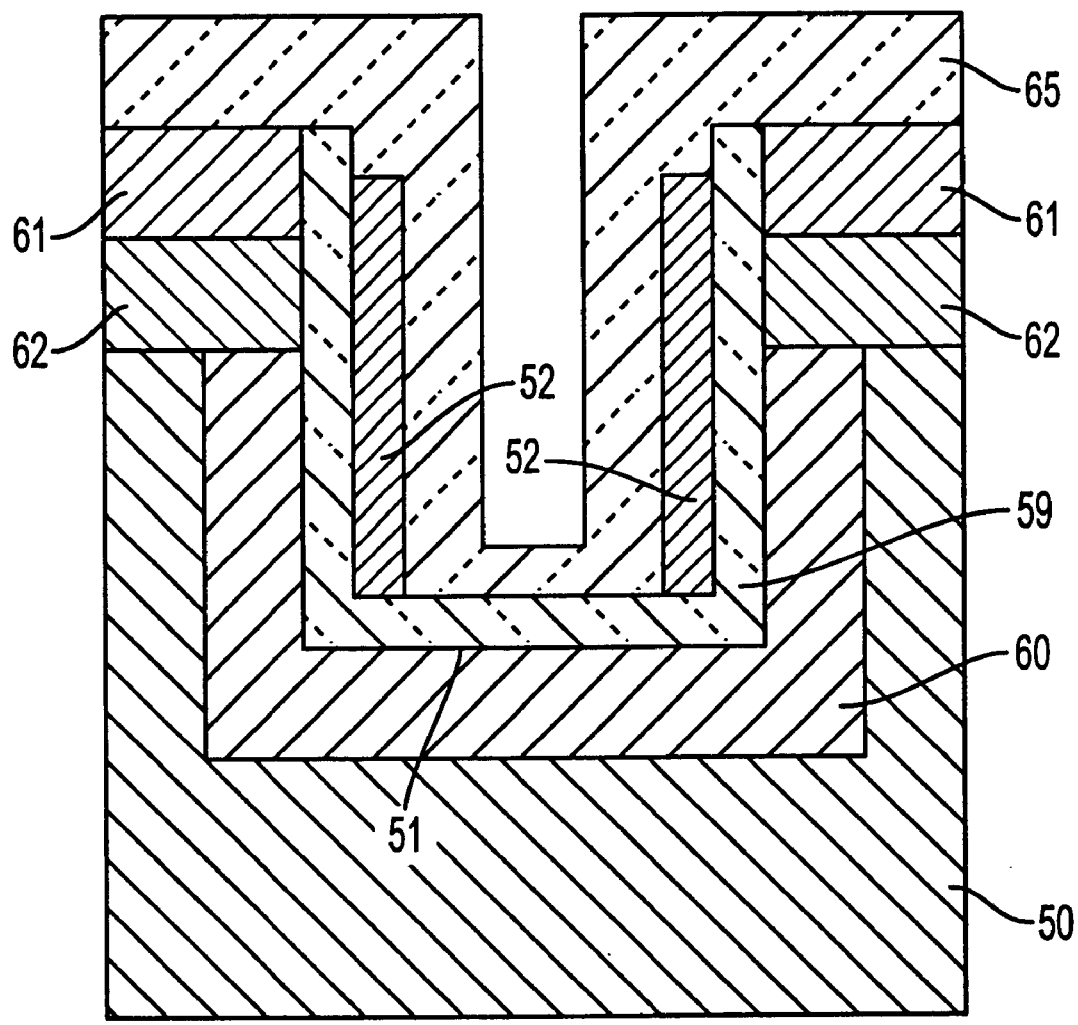
FIG. 9 is a cross-sectional view showing another a trench lateral power MOSFET embodiment in a step of a process for manufacturing a MOSFET.
Figure 10:
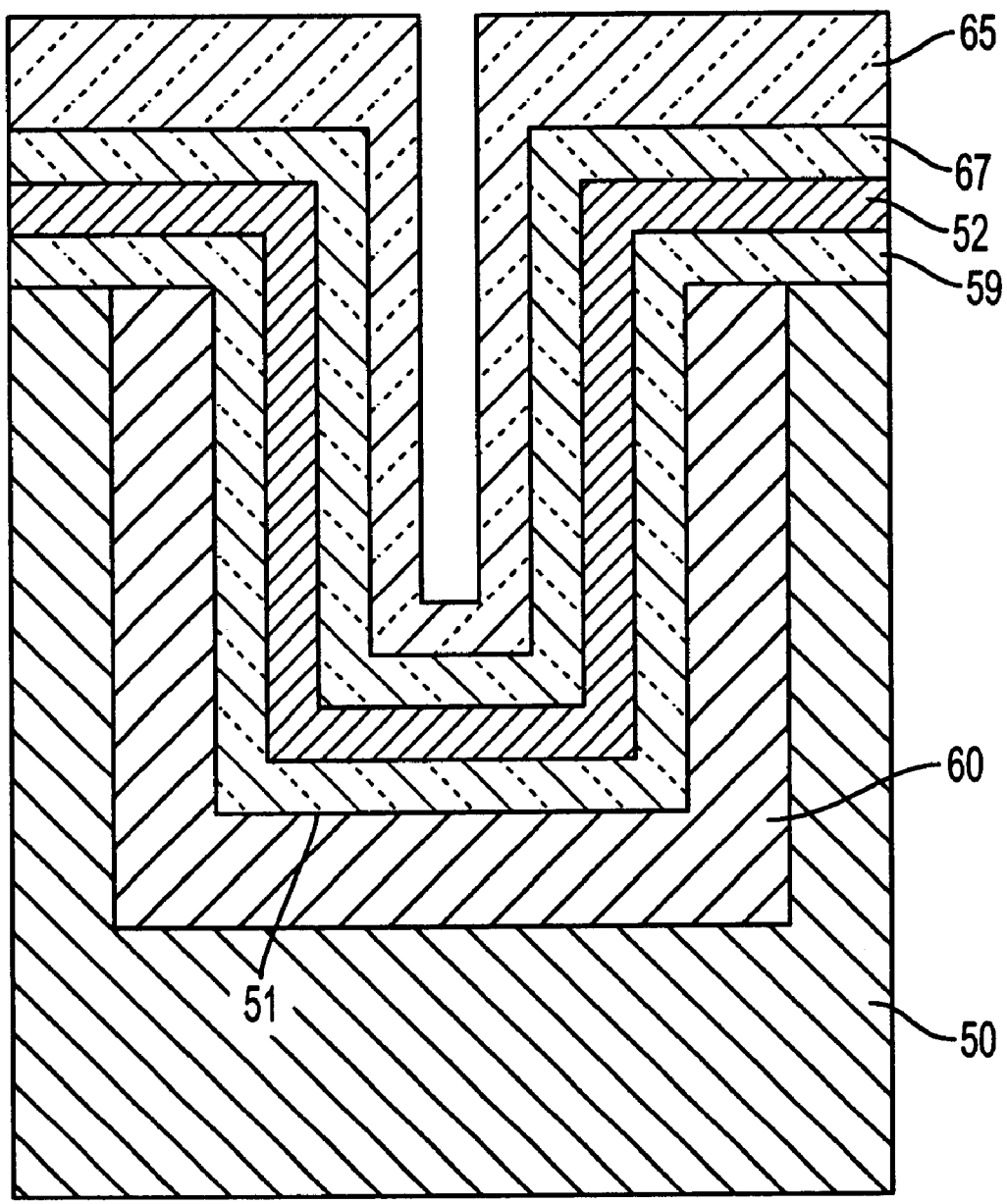
FIG. 10 is a cross-sectional view showing another a trench lateral power MOSFET embodiment in a step of a process for manufacturing a MOSFET.

Then, interlayer dielectric 65 is laminated by a deposition method of LPCVD or P-TEOS in an atmosphere at about 400° C. The deposition methods allow the deposition speed of the interlayer dielectric 65, within the trench 51, to correspond to about 50% of the deposition speed of the interlayer dielectric outside the trench on the substrate surface. Consequently, the thickness of the interlayer dielectric 65 deposited on the trench bottom surface is thinner than that on the substrate surface. See FIG. 9 showing the active region and FIG. 10 showing the gate region.

Figure 11:
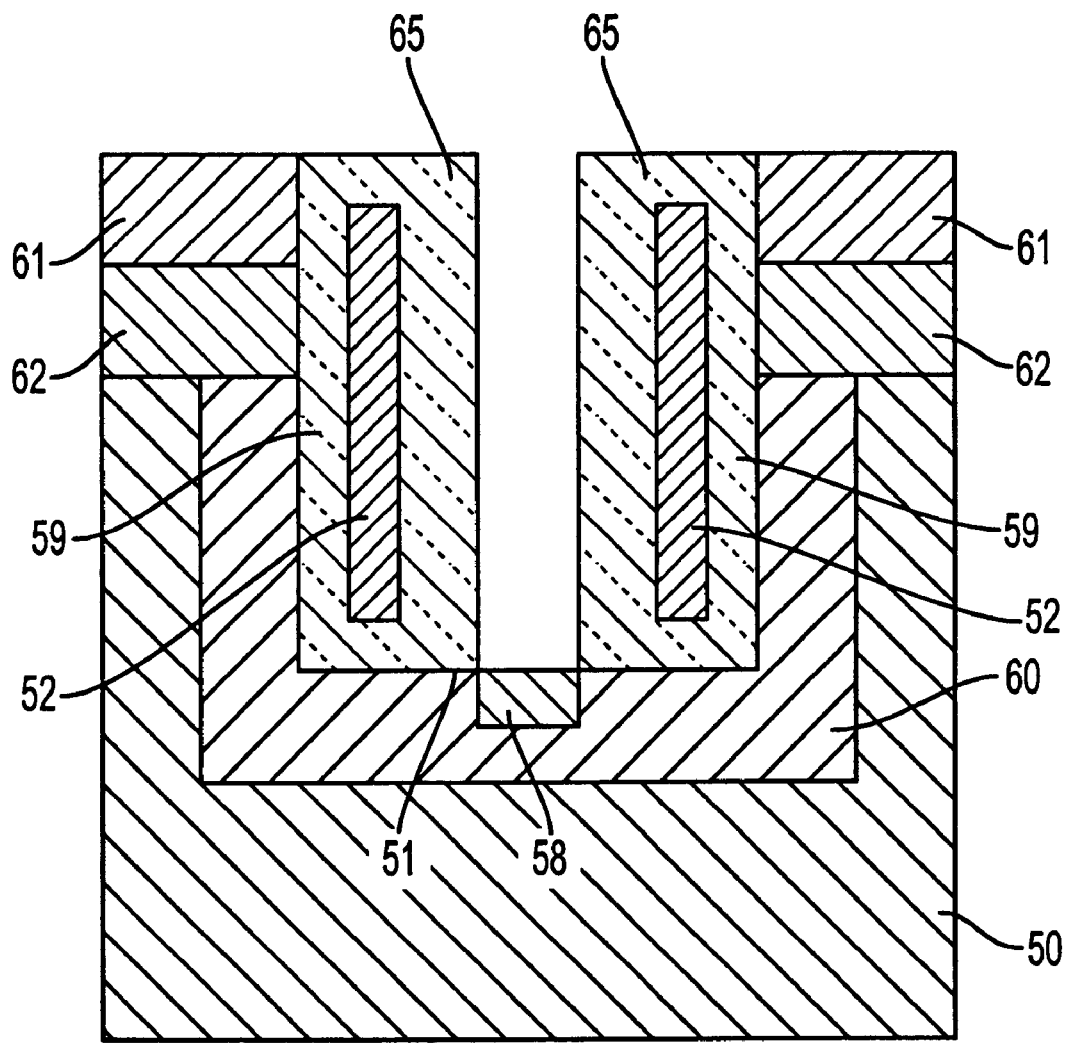
FIG. 11 is a cross-sectional view showing another a trench lateral power MOSFET embodiment in a step of a process for manufacturing a MOSFET.
Figure 12:
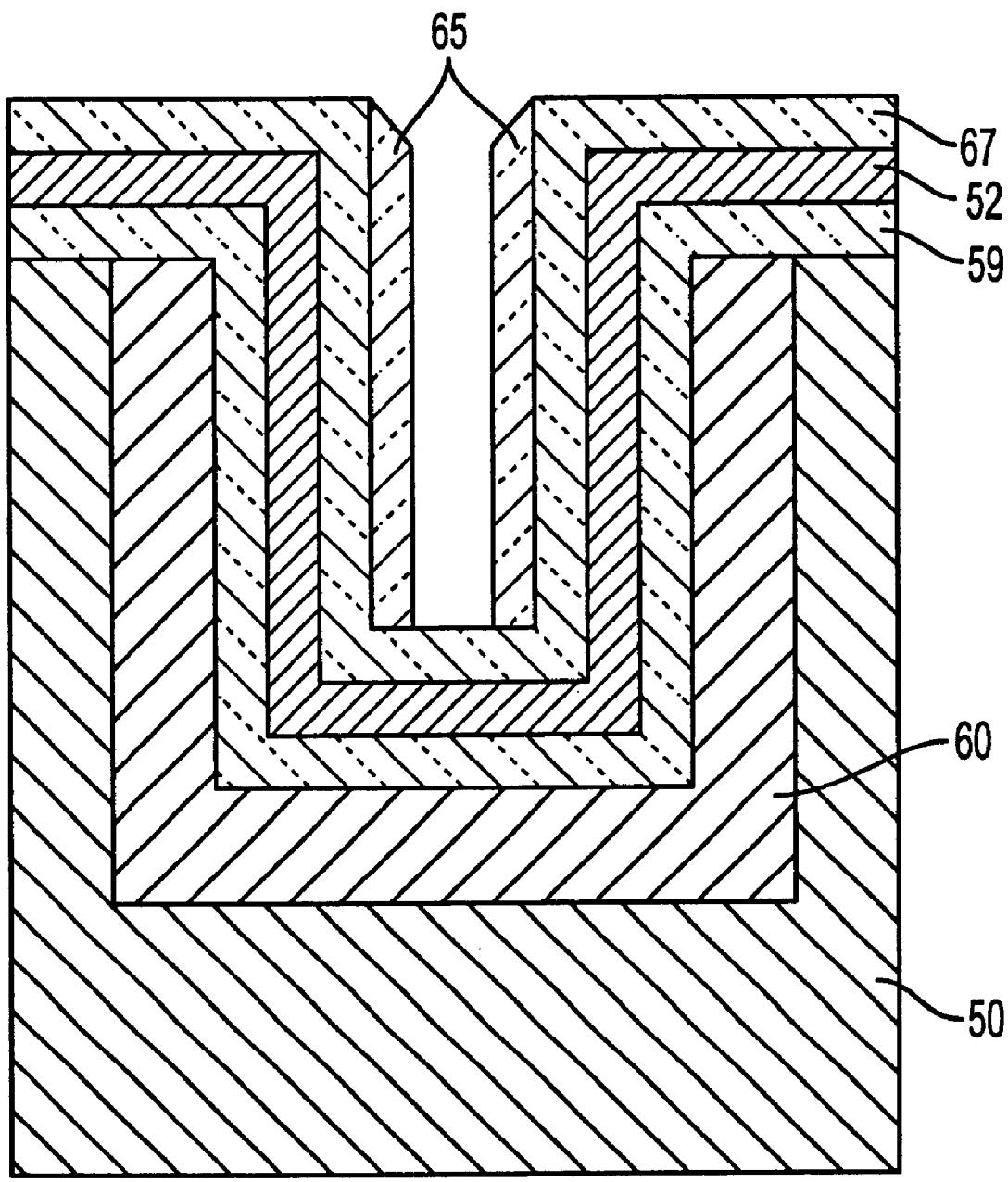
FIG. 12 is a cross-sectional view showing another a trench lateral power MOSFET embodiment in a step of a process for manufacturing a MOSFET.

Etching back of the interlayer dielectric 65 may then be conducted to open a contact hole through the interlayer dielectric at the trench bottom, leaving the interlayer dielectric on the side wall of the trench. After that, ion implantation may be conducted in the active region to form a drain region 58 that is an n+ diffusion region at the trench bottom. See FIG. 11 showing the active region and FIG. 12 showing the gate region. Subsequently, polysilicon may be deposited followed by etching back to fill the space in the trench with the polysilicon 63. Then, the whole surface is coated with interlayer dielectric 66. Contact holes are opened in this interlayer dielectric 66 and metal may be deposited to form gate electrode 53, source electrode 54, and drain electrode 55. Thus, a trench lateral power MOSFET 1, having the sectional structure of FIG. 2 in the active region, and the sectional structure of FIG. 3 in the gate region, may be accordingly manufactured.

Because the MOSFET is formed in a self-aligned manner around the trench 51, according to the above described aspect of this embodiment, a precise mask alignment is unnecessary and the device pitch can be minimized. In addition, according to the above embodiments, the channel region, which needs a certain distance to attain a high withstand voltage, may be formed vertically in the side wall region of the trench, with the drift region 60 being formed at the trench bottom corresponding to the thickness of the interlayer oxide film. These situations also reduce the device pitch.

Figure 13:
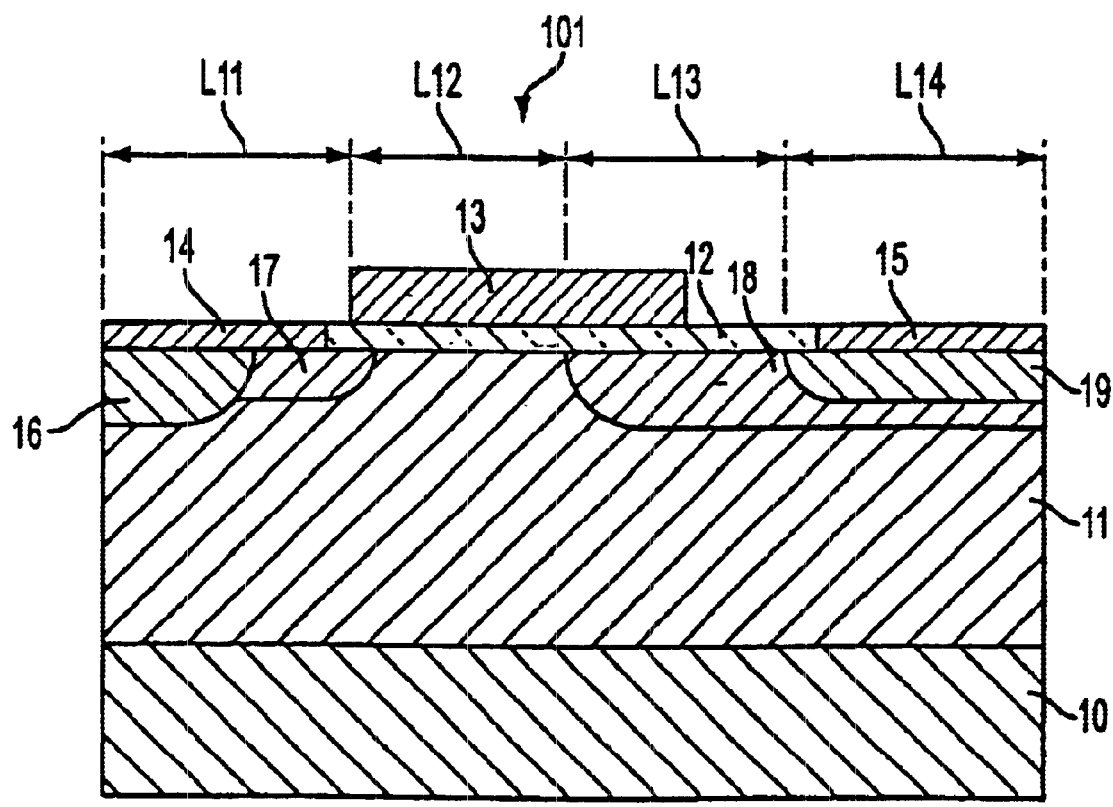
FIG. 13 is a cross-sectional view showing a structure of a conventional lateral power MOSFET for a withstand voltage of 30 V.
Figure 14:
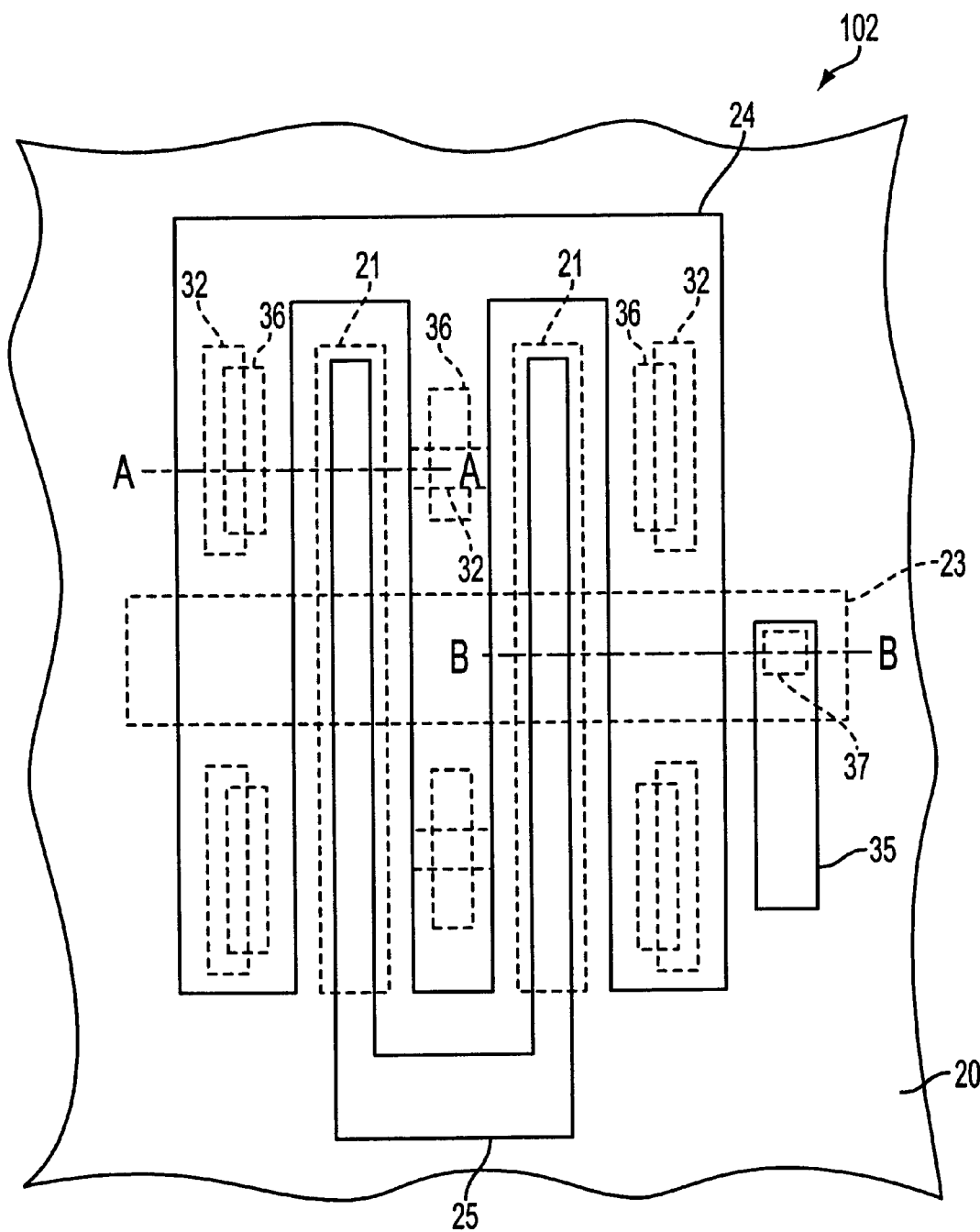
FIG. 14 is a cross-sectional view showing a structure of a conventional trench lateral power MOSFET.
Figure 15:
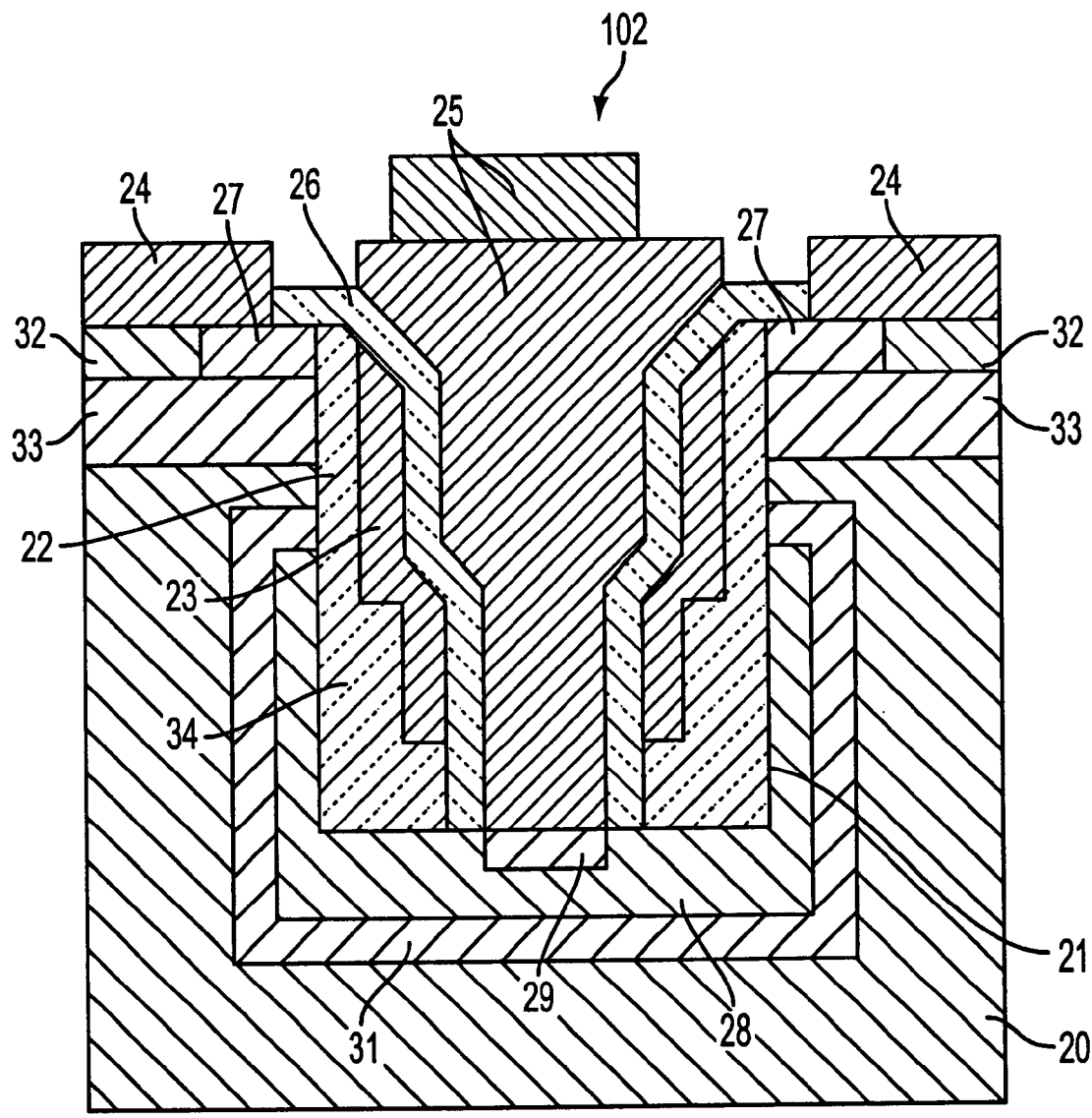
FIG. 15 is a cross-sectional view along the line A—A in FIG. 14 showing a structure of an active region of the conventional MOSFET.
Figure 16:
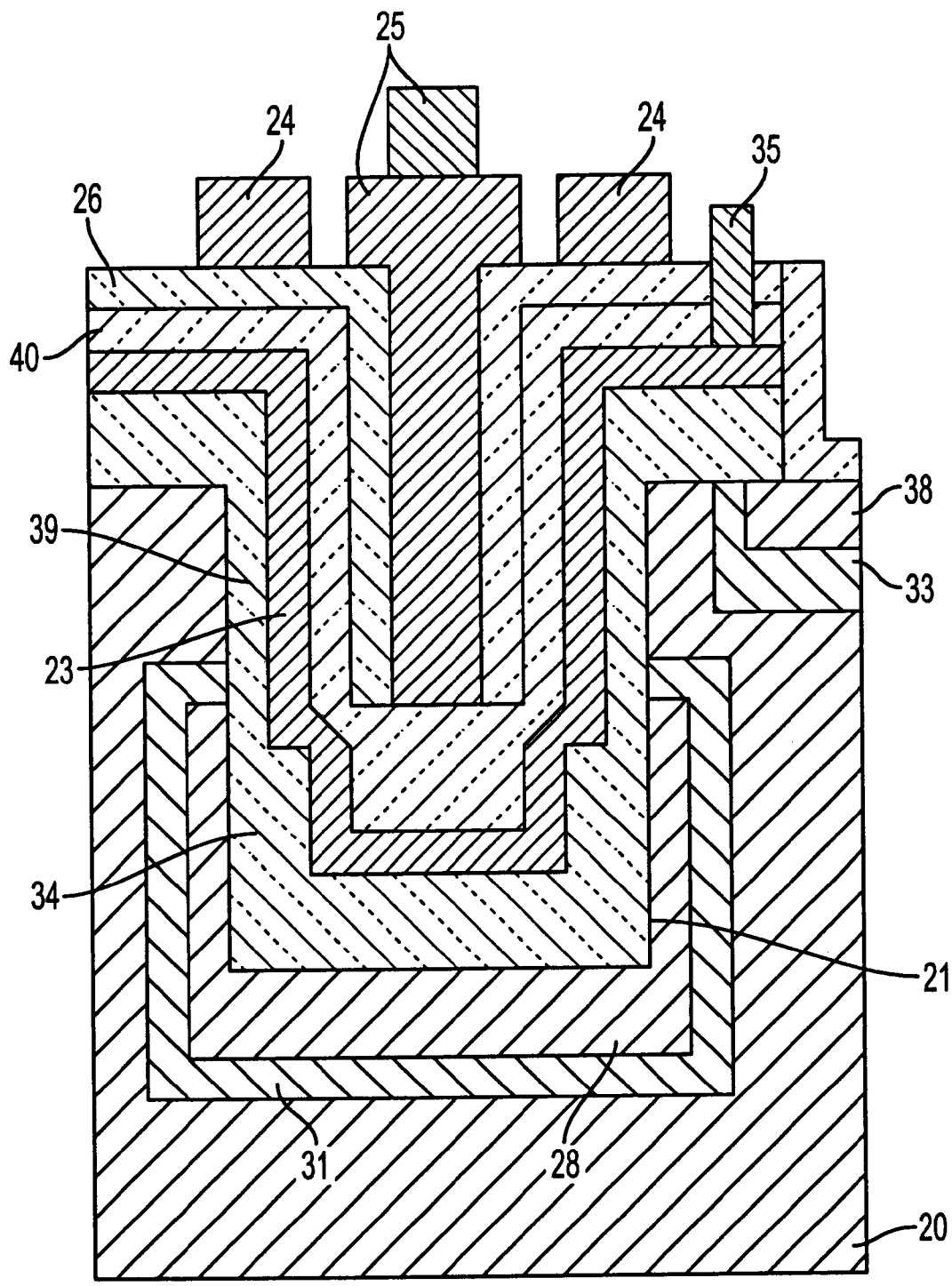
FIG. 16 is a cross-sectional view along the line B—B in FIG. 14 showing a structure of a gate region of the conventional MOSFET.

For example, the device pitch can be reduced from 5 $\mu$m to 3 $\mu$m and the trench depth can be reduced from 6 $\mu$m to 2 $\mu$m by the trench lateral power MOSFET 1 shown in FIGS. 1 through 3 compared to conventional trench lateral power MOSFET 102 shown in FIGS. 14 through 16. Since the regions for the device pitch are only the contact regions for a source and a drain, the effect of this device pitch reduction becomes more noticeable as the device becomes finer, compared to the conventional lateral power MOSFET 101 shown in FIG. 13, having a withstand voltage lower than 80 V.

The device pitch is compared between the conventional lateral power MOSFET example shown in FIG. 13, having breakdown voltage lower than 80 V, and a trench lateral power MOSFET according to an embodiment of the present invention. In embodiments of the present invention, a device pitch under the 1 $\mu$m rule would be 3.0 $\mu$m, while 5.6 $\mu$m in the conventional example; a device pitch under the 0.6 $\mu$m rule would be 1.8 $\mu$m, while 4.4 $\mu$m in the conventional example; and a device pitch under the 0.35 $\mu$m rule would be 1.05 $\mu$m, while 3.6 $\mu$m in the conventional example.

Under each rule, MOSFET embodiments of the present invention have current driving capabilities per elementary device almost equal to the capability of the conventional example. Therefore, the channel width per unit area is larger in MOSFET embodiments of the present invention, compared with conventional examples. As a result, the on-resistance per unit area of MOSFET embodiments of the present invention is reduced to 54% for the 1 $\mu$m rule, 41% for the 0.6 $\mu$m rule, and 30% for the 0.35 $\mu$m rule, compared to conventional examples. Namely, a numerical value of the on-resistance per unit area of MOSFET embodiments of the present invention, for the withstand voltage of 30 V, is 15 m$\Omega$-mm$^2$ for the 1 $\mu$m rule, 11 m$\Omega$-mm$^2$ for the 0.6 $\mu$m rule, and 8 m$\Omega$-mm$^2$ for the 0.35 $\mu$m rule.

Unlike the conventional trench lateral power MOSFET, for the withstand voltage of 80 V, as shown in FIGS. 14 through 16, a thick oxide film for securing high withstand voltage is unnecessary in a trench lateral power MOSFET according to embodiments of the present invention. Accordingly, the MOSFET embodiments of the present invention are smaller in the area of the gate and in the size of an elementary device than the conventional MOSFET. Therefore, the poor performances of excessive wiring resistance and driving losses are avoided when a conventional trench lateral power MOSFET, for the withstand voltage of 80 V, is applied to a MOSFET for the withstand voltage of 30 V.

According to an embodiment of the present invention, the manufacturing process needs trench-etching only once and thus, is simpler than the conventional process for manufacturing a trench lateral power MOSFET, for the withstand voltage of 80 V, which requires a twice trench-etching process. Therefore, greater a yield rate can be achieved in the embodiment of the present invention.

According to an embodiment of the present invention, the dielectric strength between the drain electrode 55 and the top of the gate polysilicon 52 is enhanced by controlling the amount of over-etching $t_{ov}$ of the polysilicon 72 to 0.5 $\mu$m, for example, with the polysilicon 72 becoming the gate polysilicon 52 in the completed MOSFET.

The above-described specific examples and embodiments may be modified within the scope of the present invention. For example, each dimension and surface concentration may be varied corresponding to required specifications.

According to embodiments of the present invention, the channel region, which may require a certain distance to achieve a high withstand voltage, may be formed vertically along the side walls of the trench; the drift region is formed at the trench bottom corresponding to a thickness of the interlayer dielectric; and only contact regions for a source and a drain are needed for the device pitch. These features of the embodiments of the present invention allow for a smaller device pitch than in a conventional lateral power MOSFET, for a withstand voltage lower than 80 V. Because the MOSFET is formed around the trench in a self-aligned manner according to an embodiment of the present invention, precise mask alignment is unnecessary, and smaller device pitch is attained for denser integration of elementary devices. On-resistance per unit area is also reduced because channel width per unit area increases by the reduced device pitch.

The area of the gate region and the size of the elementary device in the trench lateral MOSFET of the embodiment of the present invention are smaller than those in a conventional trench lateral power MOSFET, for withstand voltage of 80 V, because a thick oxide film is unnecessary in the MOSFET embodiments of the present invention, unlike in conventional MOSFETs. As a result, parasitic capacity developing between the substrate and the elementary device can be reduced and parasitic wiring resistance can be decreased due to shorter wiring lengths among the gate, the source, and the drain, compared to conventional trench lateral power MOSFETs, for the withstand voltage of 80 V, as being applied to a device for the withstand voltage of 30 V. Therefore, a high speed switching device is achieved and switching losses are reduced. In addition, adverse effects of noise on surrounding devices are also diminished.

A manufacturing process according to embodiments of the present invention only requires trench-etching once and thus, is simpler than conventional processes for manufacturing a trench lateral power MOSFET for the withstand voltage of 80 V, which require at least two trench-etching steps.

While this invention has been particularly shown and described with reference to preferred embodiments thereof, it will be understood by those skilled in the art that various changes in form and details may be made therein without departing from the spirit and scope of the invention as defined by the appended claims and their equivalents.

What is claimed is:

1. A semiconductor device, comprising:

a semiconductor substrate of a first conductivity type;

a trench formed in the semiconductor substrate;

a source region, of a second conductivity type, formed in a surface region of the substrate outside the semiconductor trench;

a base region, of the first conductivity type, formed under the source region outside the trench;

a drift region, of the second conductivity type, formed under the base region outside the trench along side surfaces of the trench;

a drain region, of the second conductivity type, formed at the bottom of the trench in the drift region;

a gate insulating film, having a uniform thickness, formed along the side surface of the trench and inside the trench;

a first conductor formed inside the gate insulating film;

an interlayer dielectric formed inside the first conductor;

a second conductor formed inside the interlayer dielectric and electrically connecting to the drain region;

a gate electrode electrically connecting to the first conductor;

a source electrode electrically connecting to the source region: and a drain electrode electrically connecting to the second conductor.

2. The semiconductor device of claim 1, wherein the drift region extends along the bottom of the trench.

3. The semiconductor device of claim 1, wherein an uppermost position of the first conductor is lower than a surface of the semiconductor substrate.

* * * * *